United States Patent
Xu et al.

(10) Patent No.: US 8,222,061 B2
(45) Date of Patent: Jul. 17, 2012

(54) MIST FABRICATION OF QUANTUM DOT DEVICES

(75) Inventors: Jian Xu, State College, PA (US); Jerzy Ruzyllo, State College, PA (US); Karthikeyan Shanmugasundaram, State College, PA (US); Ting Zhu, State College, PA (US); Fan Zhang, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 555 days.

(21) Appl. No.: 12/057,819

(22) Filed: Mar. 28, 2008

(65) Prior Publication Data

US 2008/0238294 A1   Oct. 2, 2008

Related U.S. Application Data

(60) Provisional application No. 60/909,160, filed on Mar. 30, 2007, provisional application No. 60/975,270, filed on Sep. 26, 2007.

(51) Int. Cl.
*H01L 21/00* (2006.01)
(52) U.S. Cl. ...... 438/34; 438/35; 438/962; 257/E31.038
(58) Field of Classification Search .................... 438/34, 438/35; 257/E31.038
See application file for complete search history.

(56) References Cited

U.S. PATENT DOCUMENTS

| | | | |
|---|---|---|---|
| 5,456,945 A | 10/1995 | McMillan et al. | |
| 5,932,295 A | 8/1999 | McMillan et al. | |
| 6,116,184 A | 9/2000 | Solayappan et al. | |
| 6,258,733 B1 | 7/2001 | Solayappan et al. | |
| 6,326,315 B1 | 12/2001 | Uchiyama et al. | |
| 6,376,691 B1 * | 4/2002 | Celinska et al. | 556/28 |
| 6,445,000 B1 * | 9/2002 | Masalkar et al. | 257/21 |
| 6,623,559 B2 | 9/2003 | Huang | |
| 6,713,389 B2 | 3/2004 | Speakman et al. | |
| 6,744,960 B2 * | 6/2004 | Pelka | 385/130 |
| 6,803,719 B1 | 10/2004 | Miller et al. | |
| 6,811,815 B2 | 11/2004 | He et al. | |
| 6,939,625 B2 | 9/2005 | Marks et al. | |
| 7,018,676 B2 | 3/2006 | Natori | |
| 7,160,613 B2 | 1/2007 | Bawendi et al. | |
| 2003/0118947 A1 | 6/2003 | Grant | |
| 2004/0082163 A1 | 4/2004 | Mori et al. | |

(Continued)

OTHER PUBLICATIONS

V. Klimov, "Nanocrystal quantum dots, from fundamental photophysics to multicolor lasing," Los Alamos Science, No. 28 92003).

(Continued)

*Primary Examiner* — Stephen W Smoot
*Assistant Examiner* — Sonya McCall Shepard
(74) *Attorney, Agent, or Firm* — Gifford, Krass, Sprinkle, Anderson & Citkowski, P.C.; Douglas L. Wathen

(57) ABSTRACT

An example quantum dot (QD) device comprises a QD layer on a substrate, and may be fabricated by aerosol deposition, for example by mist deposition. An example approach includes providing a liquid precursor including QDs dispersed in a liquid carrier, generating a mist of droplets of the liquid precursor, directing the droplets towards the substrate so as to form a liquid precursor film on the substrate, and removing the liquid carrier from the liquid precursor film to form the quantum dot layer on the substrate. Example devices include multi-color QD-LED (light emitting diode) displays, and other devices.

16 Claims, 9 Drawing Sheets

U.S. PATENT DOCUMENTS

| | | | |
|---|---|---|---|
| 2005/0095361 A1 | 5/2005 | Takamatsu et al. |
| 2005/0258418 A1 | 11/2005 | Steckel et al. |
| 2006/0196375 A1 | 9/2006 | Coe-Sullivan et al. |
| 2007/0103068 A1 | 5/2007 | Bawendi et al. |
| 2008/0001167 A1 | 1/2008 | Coe-Sullivan et al. |
| 2008/0180020 A1 | 7/2008 | Cok |

OTHER PUBLICATIONS

T. Zhu et al., "Mist fabrication of light emitting diodes with colloidal nanocrystal quantum dots," Appl. Phys. Lett, 92, 023111 (2008); DOI:10.1063/1.2834734, published Jan. 17, 2008.

P. Mumbauer, M. Brubaker, P. Roman, R. Grant, K. Chang, W. Mahoney, D.O. Lee, K. Shanmugasundaram and J. Ruzyllo, "Mist deposition in semiconductor device manufacturing," Nov. 1, 2004, Semiconductor International (from Primaxx.com).

J. Ruzyllo, D.O. Lee, P. Roman, M. Horn, P. Mumbauer, M. Brubaker, R. Grant, "Studies of high-k dielectrics deposited by liquid source misted chemical deposition in MOS gate structures," Proc. 12 Annual IEEE/DEMI Advanced Semiconductor Manufacturing Conference, ASMC 2001, Apr. 23-25, 2001.

J. Ruzyllo, D.O. Lee, K. Chang, P. Roman, W. Mahoney, V. Subramanian, K. Shanmugasundaram, P. Mumbauer, M. Brubaker, R. Grant, "Mist deposition in semiconductor device manufacturing," Paper submitted to European Solid State Device Research Conference, ESSDERC 2003. (From Primaxx.com).

D.O, Lee, "Mist deposited high-k dielectrics for next generation MOS gates," Solid-State Electronics, 46, 1671-1677 (2002) (From Primaxx.com).

D.O. Lee, P. Roman, C.T. Wu, W. Mahoney, M. Horn, P. Mumbauer, M. Brubaker, R. Grant, J. Ruzyllo, "Studies of mist deposited high-k dielectrics for MOS gates," INFOS2001, Microelectronic Engineering, 2001.

Ishikawa, T., K. Fujita, and T. Tsutsui. "Small-Area Deposition of Light Emission Polymer by Evaporative Spray Deposition from Ultradilute Solution Technique." Japanese Journal of Applied Physics 2005, vol. 44, No. 8, pp. 6292-6294.

\* cited by examiner

MIST FABRICATION OF QUANTUM DOT DEVICES

REFERENCE TO RELATED APPLICATIONS

This application claims priority from U.S. Provisional Patent Application Ser. Nos. 60/909,160, filed Mar. 30, 2007 and 60/975,270, filed Sep. 26, 2007, the entire content of both of which are incorporated herein by reference.

FIELD OF THE INVENTION

The present invention relates to improved deposition processes for device fabrication, and to devices fabricated using such processes, for example electronic displays such as quantum dot light emitting diodes (QD-LEDs).

BACKGROUND OF THE INVENTION

Semiconductor quantum dots (QDs) have recently commanded considerable attention from photonics researchers due to their interesting optical characteristics. Semiconductor QDs are typically nanocrystals (nanocrystal quantum dots, NQDs) that are smaller in size than the diameter of a Bohr exciton in a bulk crystal of the same material. The small dimensions of QDs can, therefore, apply extremely strong quantum confinement to their electronic structures and the optical processes occurring inside. This is reflected by the sharp exciton absorption features and the high photoluminescence (PL) efficiency observed for many compound QDs.

Due to the extremely narrow emission band of monodisperse QDs (FWHM ~20-30 nm), II-VI compound-based QD-LEDs have produced color-saturated emissions of much higher spectral purities than those of LCDs and OLEDs. The enhanced color purity of RGB QD-LEDs promises unprecedented improvement of the range of color vision in display applications.

Of particular interest to the display industry is developing low-cost, efficient, bright, color-saturated, large-area color displays using QDs. High expectations regarding this type of display result from the superior performance of QD-LEDs with respect to the conventional display devices such as cathode-ray tubes (CRTs), liquid crystal displays (LCDs), or organic light-emitting-diodes (OLEDs).

QD-LED displays are expected to consume much less power than LCD displays because of their high-efficiency and the emissive nature. The QD-LED luminous efficiency has a theoretical limit of 100 lm/W, equivalent to phosphor-based LEDs as opposed to fluorescent devices (25 lm/W). Yet, the luminescent decay of the QD emissive materials is an order of magnitude faster than most phosphorescent molecules, allowing high efficiency QD-LEDs even at very high brightness (such as 1000 cd/m$^2$).

In an LCD display system, a backlight illuminates every pixel on the screen. Dark pixels are created passively by blocking this light, wasting the light energy. Since quantum dots emit light rather than filtering it, a QD-LED display could potentially use only a small fraction of the power needed to operate an LCD screen used in laptops.

There are great challenges to address along the roadmap of QD-LED display technology. In order to fabricate RGB-pixel arrays of bright QD-LEDs over large surface areas for passive/active matrix displays, there is an urgent need for an appropriate technology to efficiently deposit and pattern QD layers, preferably with precise controls over thickness, composition, surface morphology, and resolution.

There remains an urgent need for a suitable technology for QD deposition/patterning for future development of QD-LED based display technology.

SUMMARY OF THE INVENTION

Examples of the present invention include processes for fabricating a quantum dot (QD) layer on a substrate. In representative examples, quantum dots (QDs) are dispersed in a liquid carrier to give a liquid precursor. Droplets of the liquid precursor are generated, for example using an atomizer to form a mist of droplets, and the droplets then impinge on the substrate to form a liquid precursor film. Removal of the liquid carrier from the liquid precursor film leaves a quantum dot layer on the substrate. Thickness control of a QD layer can be achieved within ±1 monolayer (ML) of quantum dots, i.e. a layer thickness uniformity within one QD diameter.

The use of shadow masks allows spatial patterning of a deposited film. Efficient deposition and patterning of QD layers, for displays and other applications, can be achieved using selective area mist deposition using a shadow mask. Precise controls over thickness (for example, within +/− one quantum dot diameter), composition (for example, substantially compositionally uniform emissive materials within a desired area of the substrate), surface morphology, and display resolution (for display applications) can be achieved. Multi-color QD-LEDs can be fabricated over large surface areas for passive or active matrix display applications.

In a representative example process, a liquid precursor comprises a suspension of particles, for example nanoparticles such as quantum dots suspended in a liquid carrier. The liquid precursor is converted into a fine mist with sub-micron droplet sizes, for example having a peak diameter of a size distribution of approximately 1 micron or less, for example in the order of 0.25 microns. The liquid precursor mist is carried into a deposition chamber using a carrier gas flow (such as a stream of nitrogen from a pressurized source). The droplets fall and/or are attracted electrically to the substrate, where the mist of droplets coalesces into a precursor liquid film.

The temperature of the substrate may be near room temperature, e.g. 20-25° C. The precursor liquid film on the substrate can be patterned using a shadow mask, and a thermal treatment (and/or other processes) can be used to remove some or all of the liquid carrier, giving a solid film. The deposition rate can be controlled by imparting an electrical charge to the droplets, and accelerating the droplets towards the substrate using an electric field, Deposition and patterning of films can be facilitated using choice of liquid carrier (e.g. polar or non-polar liquid carriers), substrate surface energy (e.g. hydrophilic or hydrophobic), and also surface features (e.g. ridges that facilitate film flow along but not across the ridges).

An example process for fabricating a quantum dot layer on a substrate comprises providing a liquid precursor including quantum dots dispersed (e.g. suspended) in a liquid carrier, generating a mist of droplets of the liquid precursor, directing the mist of droplets towards the substrate to form a liquid precursor film on a substrate surface, and removing the liquid carrier from the liquid precursor film to form the quantum dot layer on the substrate. An atomizer can be used to generate droplets of the liquid precursor, and the droplets may have a distributional peak diameter (or in other examples, a median diameter) approximately equal to or less than 5 microns, more particularly approximately equal to or less than 1 micron, and more particularly within the range 0.1-0.5 microns, such as approximately 0.25 microns. Selective area mist deposition can be achieved using a shadow mask to pattern the liquid precursor film formed on the substrate, allowing patterned QD films to be formed on the substrate.

A stream of carrier gas, such as nitrogen, can be used to convey a mist of liquid precursor droplets formed in an atomizer to a deposition chamber, which may comprise a shower head through which the droplets enter the deposition chamber, and a field screen. The deposition rate of the liquid precursor film on the substrate may be adjustable by varying an electrical potential between the field screen and the substrate (or other element proximate the substrate such as a substrate support). The carrier gas has an inlet speed for entering the deposition chamber, and in mist deposition the deposition rate can be substantially independent of the inlet speed, unlike typical spray deposition.

The substrate may include a plurality of electrodes, and the quantum dot layer can be formed selectively on the plurality of electrodes, for example QDs being deposited on conducting electrodes and not on surrounding non-conducting substrate material (such as glass). In some cases, apertures within the shadow mask may align with a particular electrodes, allowing QDs to be deposited on those electrodes and not other electrodes. The other electrodes may then be deposited with one or more other species of QDs, such as QDs having different emissive wavelengths in a display. For example, the substrate may further include a second plurality of electrodes, the process further including selectively forming a second quantum dot layer on the second plurality of electrodes.

A process according to an embodiment of the present invention may be used to fabricate a multi-color light emitting display such as a multicolor QD-LED display, or other devices including a photovoltaic device such as a solar cell, a sensor array, or an electromagnetic emitter.

An example multi-color light emitting display comprises a substrate, a first patterned layer supported by the substrate, comprising first quantum dots having a first diameter and a first peak emission wavelength; and a second patterned layer supported by the substrate, comprising second quantum dots having a second peak emission wavelength, the first patterned layer and optionally the second layer having a thickness that is substantially uniform to within one diameter of a quantum dot within the layer. The first patterned layer (and optionally other layers) may have a thickness that is approximately between one and ten times the diameter of the QDs in the layer, in particular between one and five times the diameter. A third patterned layer may be supported by the substrate, comprising third quantum dots having a third peak emission wavelength, for example in a red-green-blue multi-color device.

An example apparatus includes a substrate, a first layer having a first thickness disposed on the substrate, comprising first quantum dots having a first diameter, and a second layer having a second thickness disposed on the substrate, comprising second quantum dots having a second diameter, the first thickness having a thickness between 1 and 10 times the first diameter (more particularly between 1 and 5 times the first diameter), the second thickness having a thickness between 1 and 10 times the second diameter (more particularly between 1 and 5 times the first diameter).

DETAILED DESCRIPTION OF THE INVENTION

Figure 1A:
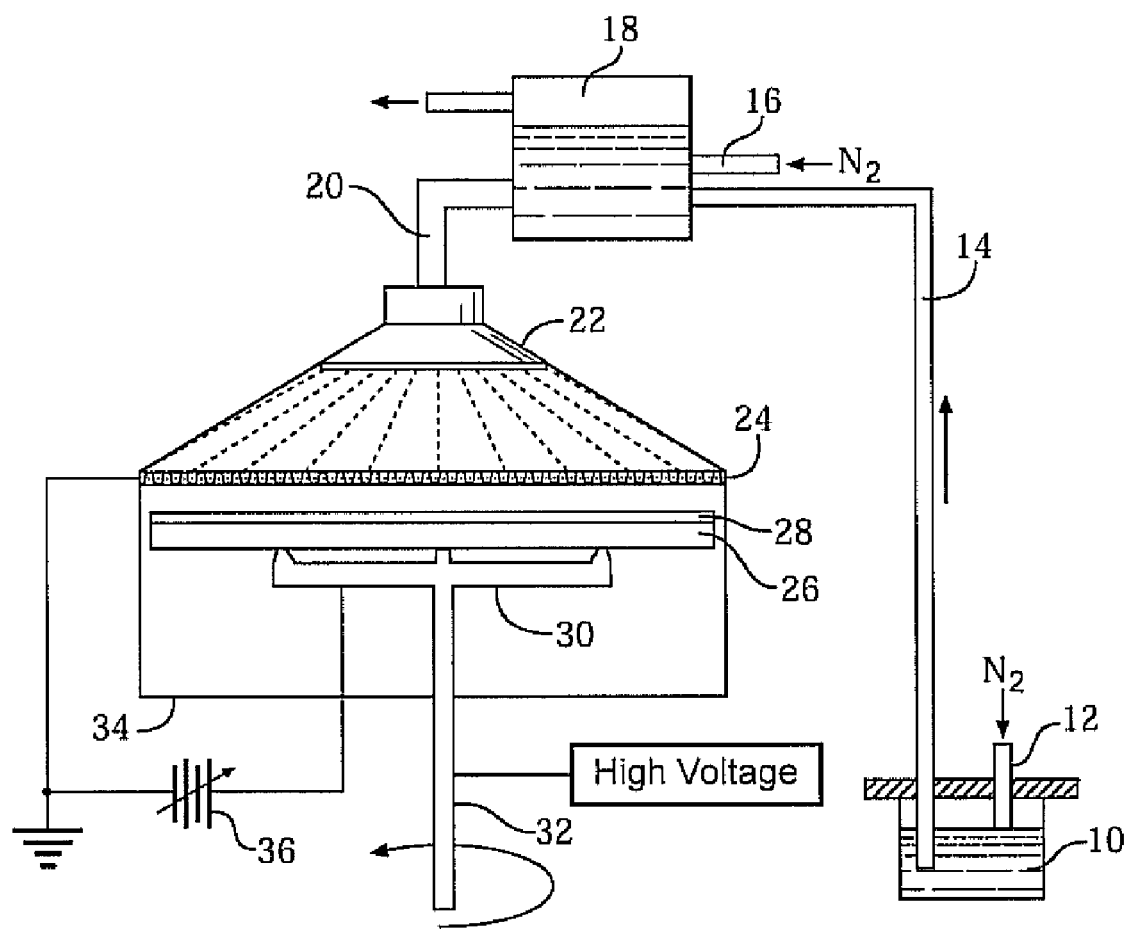
FIG. 1A is a schematic of a mist deposition apparatus.

Embodiments of the present invention relate to the use of mist deposition for the deposition of patterned quantum dots (QDs), in particular for the fabrication of quantum dot light emitting diodes (QD-LEDs). Mist deposition allows improved control over the thickness, surface morphology, composition, and resolution of QD layers, for example emissive layers in QD-LEDs, or other QD devices.

Mist deposition allows efficient area-selective deposition of patterned QD layers. Mist deposition allows thickness control on the order of monolayer precision, and the ability to form patterned films using shadow masks allows multi-color QD-LEDs to be fabricated over large surface areas for display applications.

For the first time, patterned QD films were obtained using selective area mist deposition using a shadow mask. Complex patterns of one or more materials may be formed on a substrate using sequential selective area mist deposition using a shadow mask. Sequential depositions in combination with one or more shadow masks can be used, and the masks may optionally be translated relative to the substrate between deposition steps. Sequential depositions may be used to form layers of one or more materials on a substrate, for example one or more layers of quantum dots having the same or different optical properties.

For the first time, QD-LED displays were fabricated using mist deposition. A defect-free, uniform brightness QD-LED including a mist-deposited emissive CdSe(ZnS) QD layer was fabricated. Multicolor QD-LED matrices were fabricated by selectively mist-depositing multispectral QDs with shadow masks. Successive mist deposition of multicolor QDs through a set of registered shallow masks was used to fabricate a matrix of alternating pixels comprising 5 nm diameter CdSe(ZnS) QDs (green) and 8 nm diameter CdSe(ZnS) QDs (red) on the same substrate. Full-color QD-LED displays can be fabricated using mist deposition technology. Mist deposition has never before been used for display fabrication.

Mist deposition can provide conformal coverage of solid surfaces with monolayer accuracy. Mist deposition is mostly free from the inherent limitations of conventional deposition techniques, and is compatible with selective area deposition allowing patterning of multi-color displays. Mist deposition, sometimes termed Liquid Source Misted Chemical Deposition (LSMCD) is a deposition method, for example as described in U.S. Pat. No. 5,456,945 to McMillan.

In some examples of the present invention, materials are deposited on a surface including one or more patterned electrodes. Electrical potentials may be selectively applied to the patterned electrodes to facilitate deposition of desired structures. For example, if quantum dots are intended to be deposited on particular electrodes, those electrodes may be maintained at an electric potential opposite to that imparted to the droplets, whereas electrodes on which quantum dots are not desired to be deposited may be given an electric potential of the same sign as that of the droplets.

Hence, a method of forming a patterned layer of a material on a surface includes generating a liquid precursor droplets comprising a liquid carrier and a suspension of the material, masking the substrate surface using a shadow mask, and exposing the substrate surface to a mist of the liquid precursor droplets through a shadow mask. The term "solvent" may occasionally be used to refer to the liquid carrier used, but suspensions (and not true solutions) of particles may be used.

On removal of the liquid carrier from the deposited film, a patterned layer of the material remains. This may be a patterned film of particles, such as nanoparticles having a diameter of less than approximately 100 nm, in particular, quantum dots. The pattern configuration is determined largely by the conformation of the shadow mask. The shadow mask may include one or more apertures, such as slots, holes, or other shapes, so as to selectively allow droplets to impinge on the surface. For example, a slot aperture in a shadow mask may be registered (aligned) with a stripe electrode to obtain selective area coverage of the electrode. The surface may be exposed to the droplets through mist deposition, as described in more detail elsewhere. However other deposition techniques may also be used such as any form of aerosol deposition including spray deposition.

Mist deposition typically uses smaller droplet sizes than spray deposition. For example, the droplet diameter distribution for mist deposition may follow a Gaussian-like size distribution with a peak value diameter. The peak value diameter may be approximately 5 microns or less, such as approximately 1 micron or less, such as 0.5 micron or less, for example more particularly 0.25 micron or less. In spray deposition, the peak droplet diameter may be greater than 5 microns, such as approximately 25-50 microns or greater.

Selective area aerosol deposition, including selective area mist deposition and selective area spray deposition, may be used to deposit various materials on a surface. For example the material to be deposited may include quantum dots, quantum wires, other nanostructures, molecules, polymers, magnetic particles, and the like.

The techniques described herein allow, for the first time, a large area multicolor display to be fabricated using quantum dots, in which the deposited layers of quantum dots are consistent thickness within ±1 monolayer over the surface. For this example, a large display may be one having a diameter of approximately equal to or greater than 4 inches.

Mist deposition can be used for liquid-source misted chemical deposition of thin films. In an example approach, a liquid precursor material is converted into a fine mist with a droplet size in the order of 0.25 microns, which is then carried into the deposition chamber in a pressurized stream of nitrogen gas. The droplets are allowed to coalesce on the substrate at room temperature. A uniform film or patterned film of liquid forms on the substrate, which may then be thermally treated to remove the liquid carrier and leave a thin film on the substrate surface. The deposition rate may be controlled by accelerating the droplets under the influence of an electric field. Selective film deposition and pattern formation may also use conventional lithography to spatially modify the surface energy, or use selective area mist deposition to deposit a patterned layer that promotes adhesion of the QDs to a substrate.

Figure 1B:
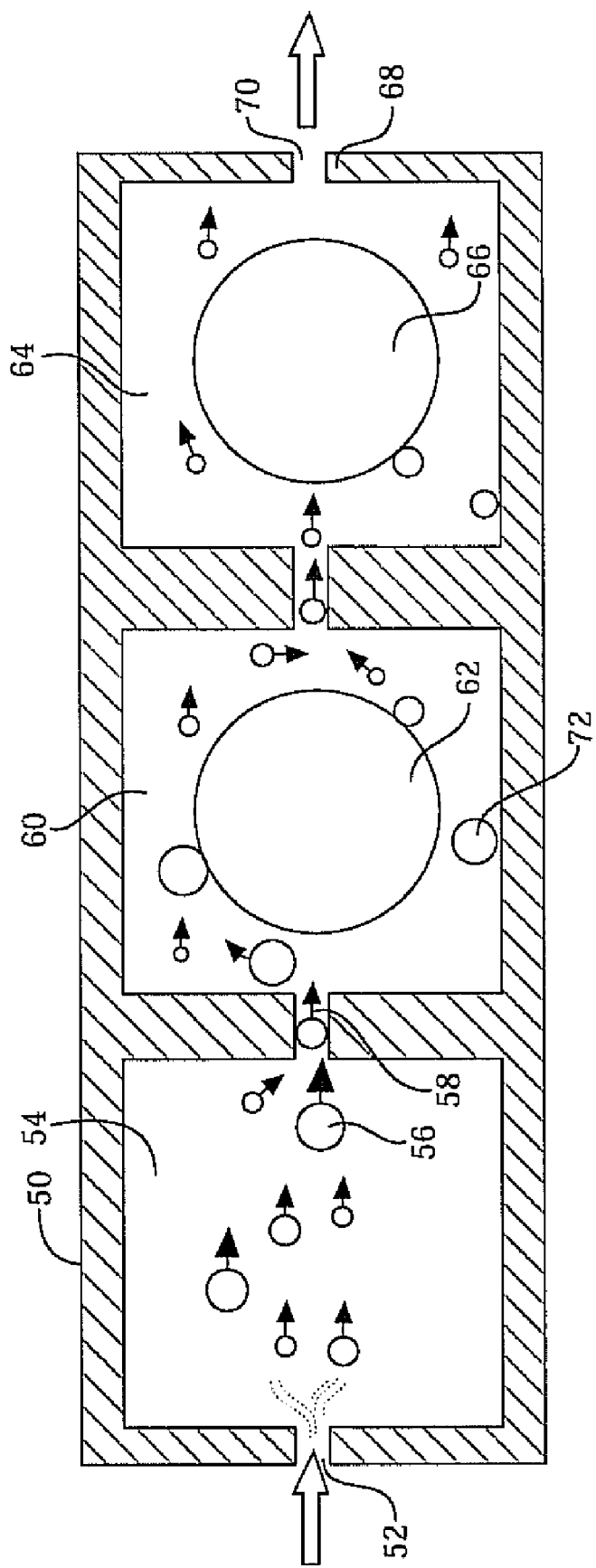
FIG. 1B shows an atomizer arrangement.
Figure 2A:
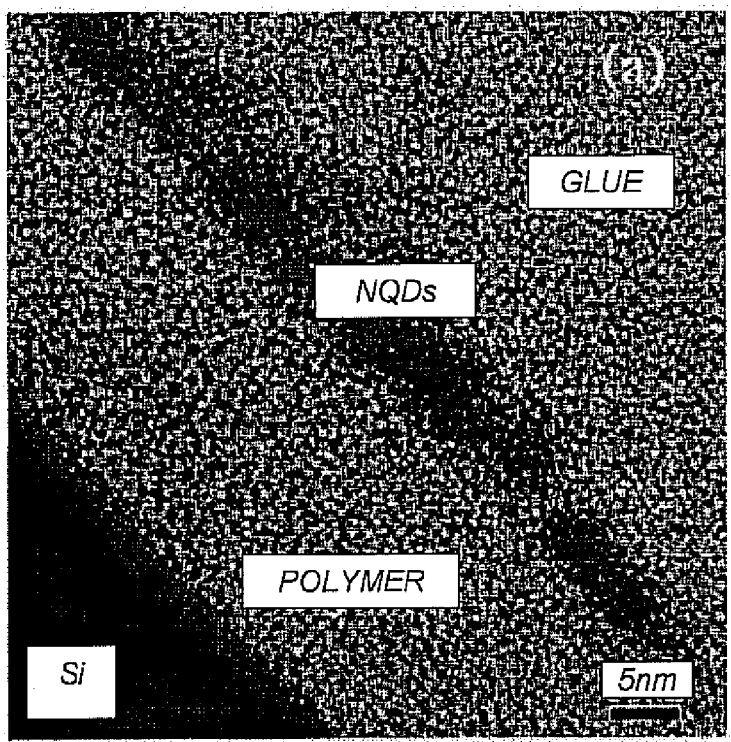
FIGS. 2A-2B show cross-sectional TEM images of QD layers of 1 ML (monolayer) and 5 ML thickness (respectively) deposited by mist deposition.
Figure 2B:
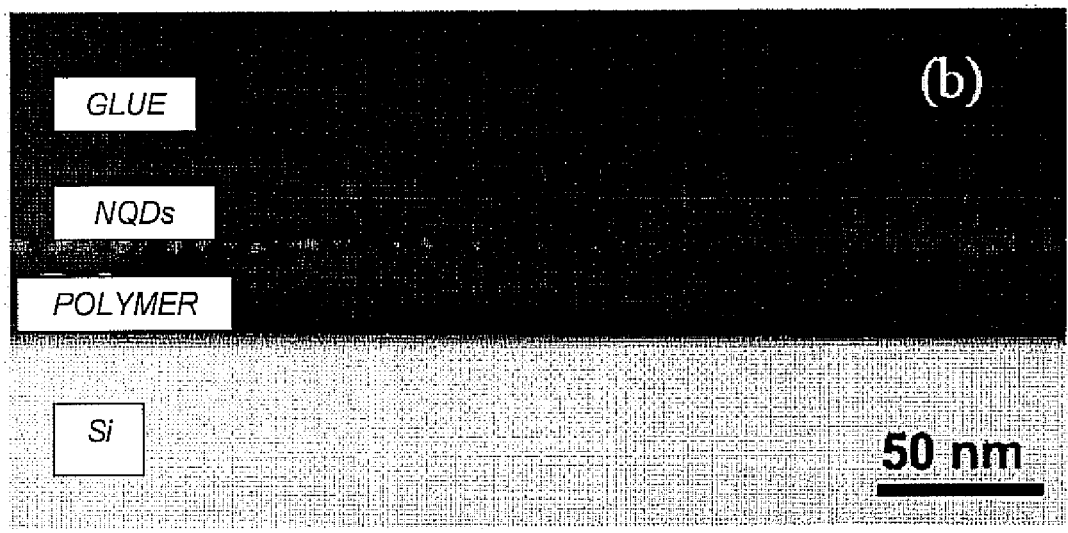
Figure 3:
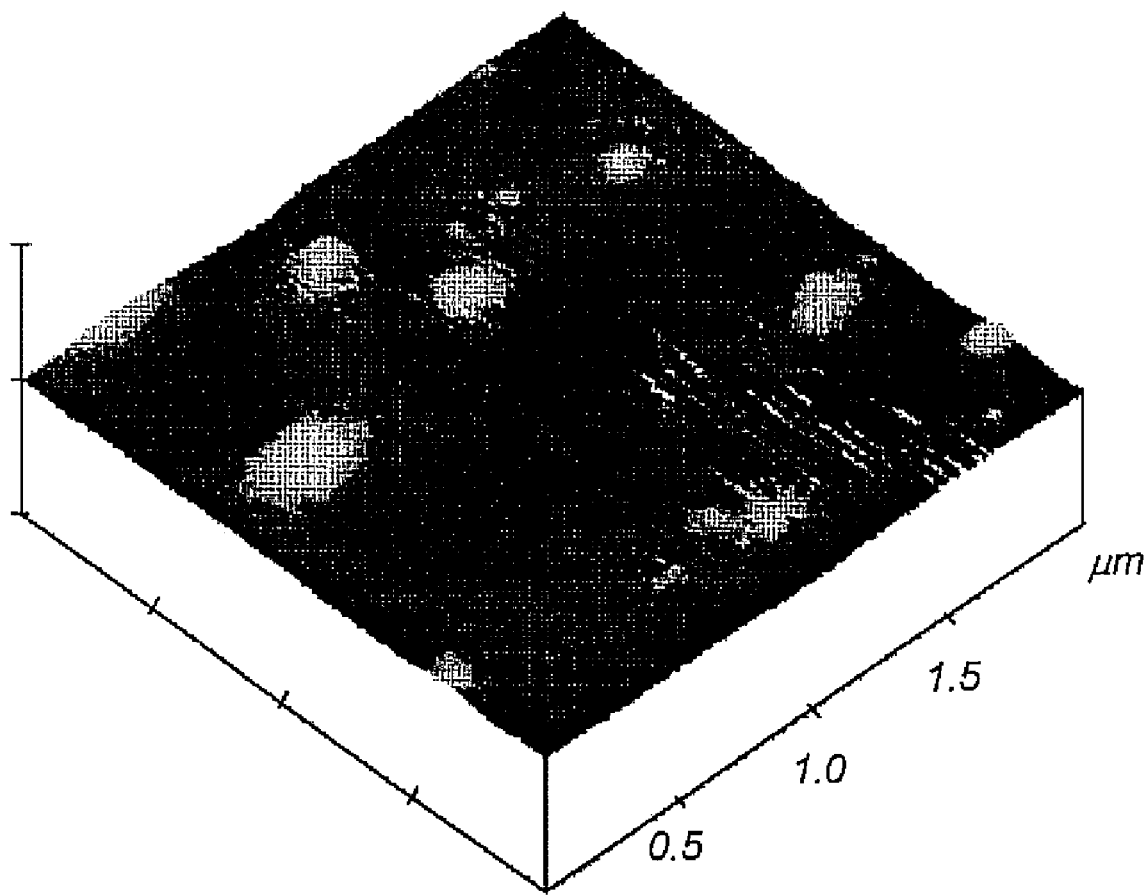
FIG. 3 shows an AFM image of the surface of a 34 nm film (~4 ML) of CdSe(ZnS)-QDs mist-deposited over a silicon wafer.

FIG. 1A shows a schematic of an example mist deposition apparatus. A QD-dispersed liquid precursor is supplied from a reservoir, and flows into an atomizer by nitrogen pressure. Size selection of mist droplets is carried out by inertia separation with mass impactors in the atomizer, as shown in FIG. 1B.

FIG. 1A shows the liquid precursor supplied by a liquid source 10, here comprising a stainless steel container containing the liquid precursor, flowing to the atomizer along channel 14 under the pressure of a carrier gas (in this example, nitrogen) input at 12. In the atomizer 18, the liquid precursor is converted into a very fine mist through interactions with a series of impactors (discussed further below in relation to FIG. 1B). In an example atomizer configuration, the average size of the droplet in the mist 20 output by the atomizer was about 0.25 μm, but can be smaller or larger for a different impactor configuration. The mist is then carried by nitrogen (with a second carrier gas input at 16 into the atomizer 18) into the deposition chamber 34. The mist passes through the shower head 22, which helps create a uniform spatial distribution, and passes through a field screen 24 before coalescing as a liquid film 28 on the surface of the substrate 26. The substrate surface may be at room temperature, and the pressure very close to atmospheric pressure. The substrate may optionally be slowly rotated, e.g. at 10 rpm, on rotating substrate support 30 with drive spindle 32. A high voltage source 36, in this case 0-10 kV, is used to apply an electric potential to the substrate support (or directly to the substrate) relative to the grounded field screen.

The size distribution peak diameter of the droplets produced in the mist deposition can be one or two orders of magnitude smaller than for conventional spray deposition. For example, the distributional peak diameter may be $\leq 10$ μm, in some examples $\leq 1$ μm, more particularly $\leq 0.25$ μm. In contrast, the distributional peak diameter may be ~25-50 μm for spray deposition. Mist deposition allows unprecedented (compared with other liquid physical deposition methods) film thickness control, in some examples down to a single nanometer level.

After deposition, the film may be solidified by subjecting the substrate to a temperature (for example, lower than 250° C. such as 50° C.-100° C.) curing in ambient air or in nitrogen at the atmospheric pressure. Temperatures required to remove a liquid carrier may be low enough to allow selective area deposition on complex active matrix substrates.

To control the deposition rate beyond gravitational interactions, which in the case of sub-micron sized droplets are very weak, an electric field is created between the grounded field screen 24 and the substrate 26, in this example a silicon wafer as shown in FIG. 1A. By controlling the electric field above the substrate surface the deposition rate can be precisely controlled. After deposition, the film can be thermally cured in the temperature range of e.g. 50-100° C. in ambient air at the atmospheric pressure to form mechanically coherent surface coverage, even in small thickness values, for example below 3 mm.

FIG. 1B shows an atomizer 50 that can be used with the configuration shown in FIG. 1A. A mist stream generated at the atomizer inlet 52 is carried by the flow of the carrier gas (nitrogen) through three cascaded chambers. The first chamber is shown at 54, the second at 60, including first impactor 62, and the third chamber 64 includes impactor 66. The precursor droplets (here, QD dispersed mist droplets) are swept through the narrow passages between the atomizer wall and the mass impactors with high velocity.

Heavy droplets of large diameters, whose inertia exceeds a critical value, cannot follow the mist stream and hence collide with the impactor and either stick to it or fall to the bottom of chamber (e.g. droplet 72). Lighter droplets are able to follow the carrier gas stream and move to the next chamber and undergo another inertial separation to further narrow the size range of mist droplets. Through interactions with a series of impactors, the QD-dispersed liquid carrier is eventually converted into ultrafine mist droplets 70 at the atomizer outlet 68.

In an example approach, the atomizer was designed to generate a sub-micron diameter mist that traveled along with the carrier gas. Toluene was chosen as the liquid carrier to disperse 5 nm CdSe QDs, because of its nonpolarity and adequate volatility. Other liquid carriers may be used, including water. The final size of the mist droplets is typically given by a Gaussian distribution, and a peak diameter of approximately 0.25 microns was obtained.

In representative experiments, it was estimated that, on average, there were about five CdSe QDs in each mist drop of QD solution of 0.25 microns diameter ($8\times10^{-15}$ ml in volume) when the optical density of the QD solution was 0.25 at the first-order excitonic wavelength. To control the deposition rate beyond gravitational effects, which in the case of submicron sized droplets are very weak, an electric field is created between the grounded field screen and the substrate. Since the mist droplets become charged at the point of mist generation as they are separated from the bulk liquid by the shearing friction, the deposition rate can be precisely controlled by controlling the electric field above the substrate surface. After deposition, the QD film can be thermally cured to create a homogenous surface coverage even in the low-thickness regime.

FIGS. 2A-B show the cross-sectional TEM images of QD layers deposited over poly(3,4 ethylenedioxythiophene): poly(styrenesulfonate) (PEDOT/PSS)—coated silicon substrates. The QD films in the TEM images have been overcoated with resin glue (M-Bond 610, Structure Probe, Inc.) to protect them from damage during the preparation of cross-sectional TEM samples.

FIG. 2A shows CdSe QDs 102 are clearly discernable at the interface between the PEDOT/PSS polymer layer 104 and the glue layer 100, supported by silicon substrate 106. The well-resolved fringes in the nanoparticle region suggest single crystalline domain in the nanocrystal QDs without noticeable defects. The scale on the image is 5 nm, which verifies that each of the quantum dots (dark circles) is approximately 5 nm in diameter and there is a "layer" of quantum dots, only 1 ML thick, in the inspected region of the sample.

FIG. 2B is similar to FIG. 2A, and shows a layer of quantum dots approximately 25 nm thick between a polymer layer and a glue layer, indicating approximately five layers of quantum dots. The layer exhibits a uniform thickness, and its top and bottom surfaces appear to be completely filled with quantum dots. Hence, precise control over QD layer thickness in mist deposition was shown by high-resolution-transmission electron microscopy (TEM).

FIG. 3 shows an AFM image of the surface of a 34 nm film (~4 ML) of CdSe(ZnS) QDs mist-deposited over a silicon wafer. The RMS roughness is less than 1 nm, in this case ~0.8 nm. This is substantially less than one monolayer. The deposition potential was 8 kV; the carrier gas flow rate was ~1 ml/min with a nitrogen pressure of 60 psi; and the deposition time was 6 min.

Accurate control of the QD layer thickness, preferably down to monolayer resolution, is important for commercial development of QD-LED displays. Using mist deposition, the thickness and uniformity of QD films can be controlled by the process variables, including the QD concentration (e.g. number of particles per unit volume) in the liquid carrier, the flow rate of the nitrogen carrier gas, and/or the intensity and spatial distribution of the electric field applied between the grounded field screen and the substrates. A nominal film thickness obtained for experimental QD-LED devices was 25 nm (~3 monolayer of QDs).

Bright QD-LEDs are achieved with devices containing QDs of between 1 and 10 monolayer thickness, more particularly between 1-5 monolayer (ML) thickness of QDs. The use of mist deposition allows monolayer thickness control over large areas, for improved display fabrication, particularly for large area displays.

TEM images indicated that QDs packed disorderedly in the mist-deposited films due to the rapid evaporation of the liquid carrier from the substrate. The disordered arrangement of QDs, however, was found to have little impact on the LED efficiency when compared with the effect of QD film-thickness. Evaporation rate can be controlled through choice of liquid carrier volatility and substrate temperature, and may be reduced if a more ordered film is required.

The reduced droplet size (0.25 μm or less) produced by the atomizer in the experiments (compared with spray deposition) leaves fewer QDs in each droplet volume. This allows uniform, non-aggregated distribution of QDs in the thin film. On average, there were about five CdSe QDs in each mist droplet of QD solution of 0.25 μm-diameter (~8×10-15 ml in volume) when the optical density (O.D.) of the QD solution is 0.25. These numbers are exemplary, and other values may be used. The use of TOPO surfactant molecules over the QD surface also helped avoid the aggregation of QDs upon evaporation of the liquid carrier.

Example QD-LED Fabrication

QD-LEDs may be fabricated by controlling the QD layer thickness and using poly-TPD as a hole transport layer. Solution processible core-shell QDs with CdSe core and ZnS or CdS/ZnS shell were used as the emission layers. Bright and color-saturated red (peak wavelength of 619 nm), orange (595 nm), yellow (575 nm) and green (526 nm) light emissions were realized with a narrow electroluminescence (EL) bandwidth.

The maximum luminance of the red, orange, yellow, and green QD-LEDs reached 9064, 3200, 4470 and 3700 cd/m2, respectively, representing the highest luminance reported so far for the corresponding color QD-LEDs. (The average brightness of a laptop screen is only about 200 cd/m2). In addition, the devices also featured low turn-on voltages (3-4 V), high EL efficiency (1.1-2.7 cd/A), and longer operation life time (t50%=600 hrs @>550 cd/$m^2$).

The device quality of the mist-deposited QD layers were assessed by evaluating the performance of LEDs containing mist-deposited core/shell CdSe/ZnS QDs. An LED was fabricated with a multilayer structure of indium tin oxide (ITO)/PEDOT-PSS/poly(N,N-bis(4-butylphenyl)-N,N-bis(phenyl) benzidine (poly-TPD)/1 ML thickness layer CdSe/ZnS QDs/Al.

FIG. 4A shows the current density and radiance power versus applied voltage for a red QD-LED fabricated using mist deposition process. The current density and luminance curves are shown as the function of applied voltage (I-V and L-V curves) for the LED.

FIG. 4B shows the emission spectrum of a functional LED fabricated using mist deposition, emitting radiation at 150 cd/$m^2$. This was the first time a QD-LED was fabricated using mist-deposited QDs.

Figure 4A:
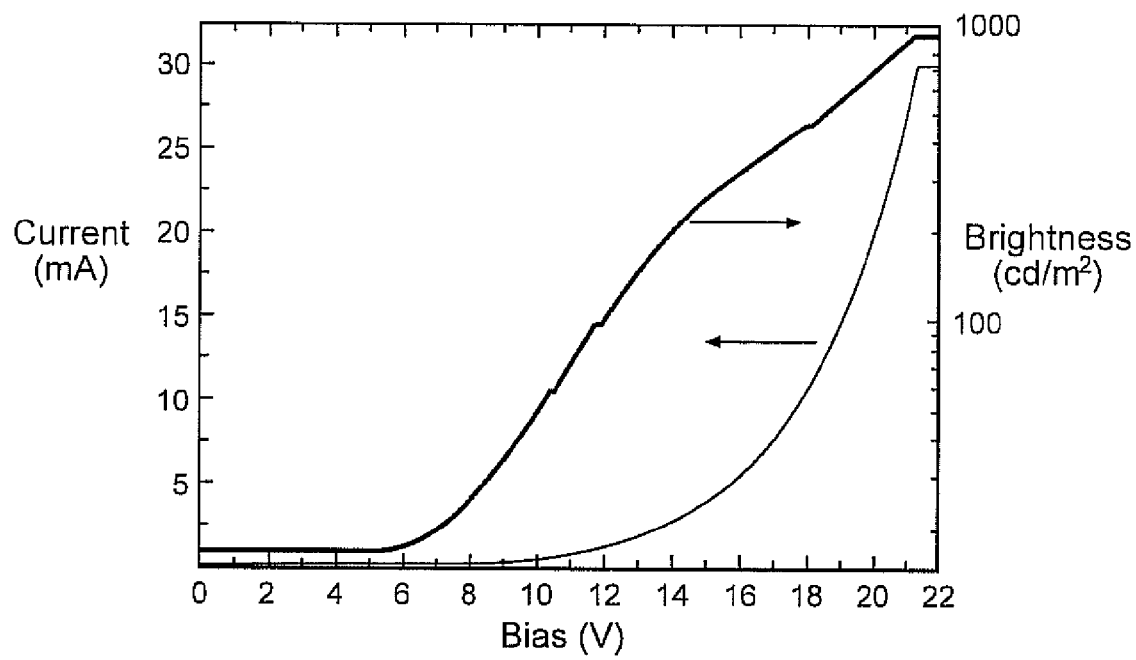
FIG. 4A-4D show the current density and radiance power versus applied voltage, emission spectrum, and image for a red QD-LED fabricated with a mist deposition process.
Figure 4B:
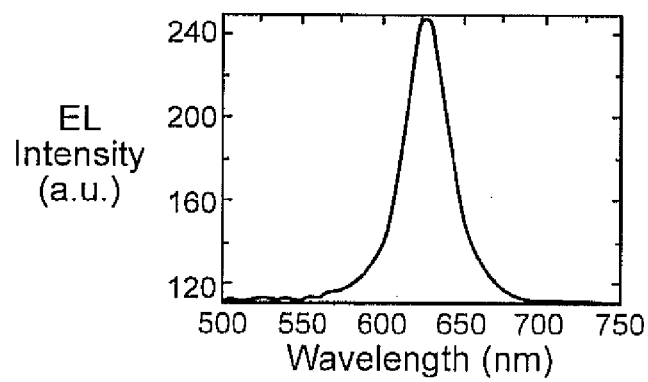
Figure 4C:
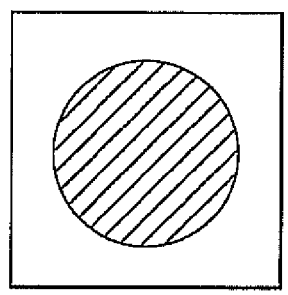
Figure 4D:
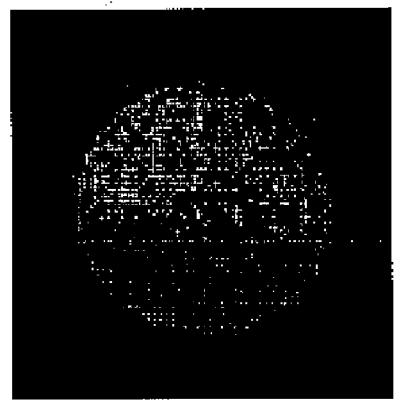

FIG. 4C is an graphic representation of an LED having the emission spectrum of FIG. 4B. The mist-deposited QDs in the red-emitting LED give bright, uniform, defect-free EL emission over the pixel area of 7 mm². The device had low turn-on voltages of about 5 V, confirming the minimized barrier height for the charge injection in the QD-LEDs formed. The maximum luminance reached 1032 cd/m² at a bias voltage of 21 V, and the luminous efficiency is calculated as 0.5 lm/A. FIG. 4D is a photograph of the QD-LED, indicated at 130 and corresponding to the graphic representation of FIG. 4C, and which is a black-and-white representation of a red emitting device.

Although this first ever mist deposition fabricated QD-LED does not outperform the spin-coated ones in intensity, this experiment showed that mist deposition can be used in high quality QD-LED fabrication. Mist deposition inherently provides extremely precise control over the thickness and morphology of nanocrystalline films, so that superior QD-LED performance can be obtained by optimizing parameters in the mist deposition process.

The use of mist deposition allows thickness control at the monolayer level, important for obtaining efficient display operation. Thicker QD films increase the operating voltage and decrease the carrier injection efficiency due to slow dot-dot transport. The EL efficiency of QD devices is known to drop significantly (~60-80%) when the actual thickness of QDs in LEDs is off target by even one monolayer (5-10 mm).

Further, mist deposition can be used to prepare patterned films, which is not readily possible with spin-coating without a subsequent lithography step. Mist deposition allows patterned films of a plurality of particle species to be deposited on the same substrate, which is not readily achieved using spin coating. For example, different particle species may be different QD diameters having different peak emission wavelengths.

Example Display Fabrication

RGB-pixel arrays of bright QD-LEDs were designed and fabricated using the selective area mist deposition of multicolor QDs.

Figure 5C:
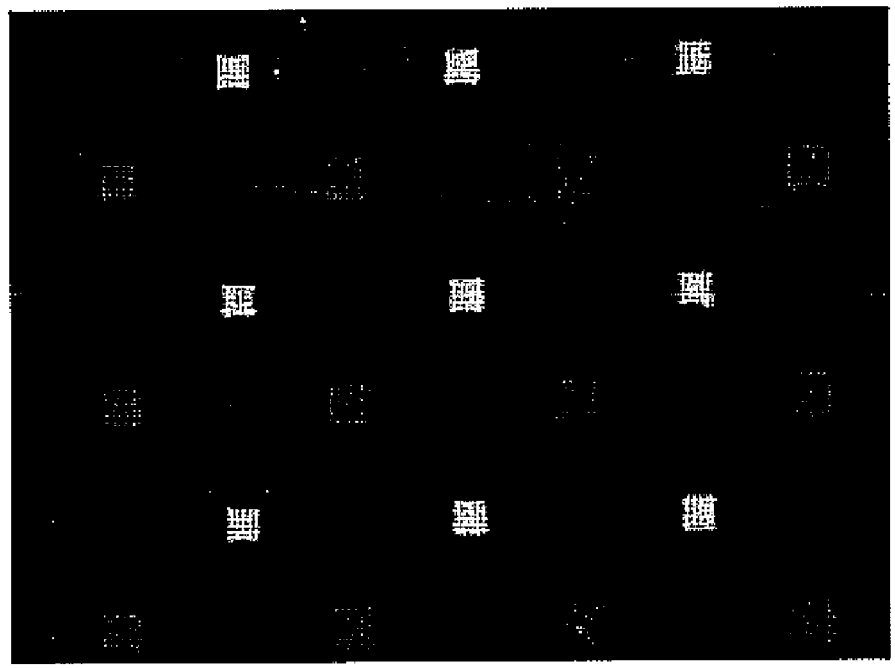
FIG. 5A-5C show an ITO glass plate carrying 6×6 matrix of alternating pixels composed of 5 nm-diameter CdSe(ZnS) QDs (green) and 8 nm-diameter QDs (red) under Uv illumination, and a normalized PL spectra of patterned QD films.
Figure 5A:
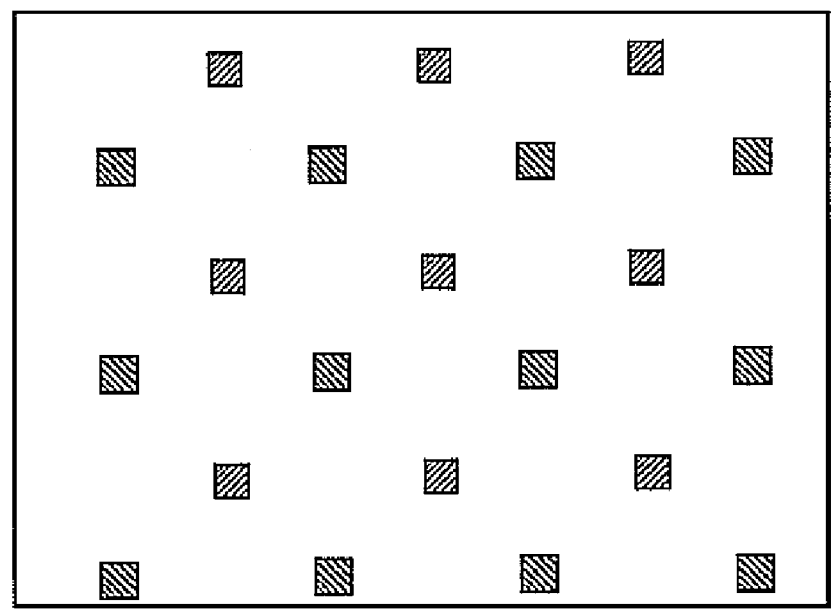

FIG. 5A illustrates generally a 6×6 matrix of alternating pixels comprising 5 nm-diameter CdSe/ZnS QDs (green) and 8 nm-diameter CdSe/ZnS QDs (red) on a glass substrate fabricated by sequential mist-deposited though two optically-aligned shadow masks. The emission wavelength is tuned using the QD diameter.

FIG. 5C shows a fluorescence image taken under UV-illumination. The surface dimension of each QD pixel, such as pixel 132, is 500 μm×500 μm. The thickness of the pixelated film is ~50 nm for red QDs (6 ML) and ~30 nm for green QDs (6 ML), which were chosen to ease the observation of fluorescence images.

Figure 5B:
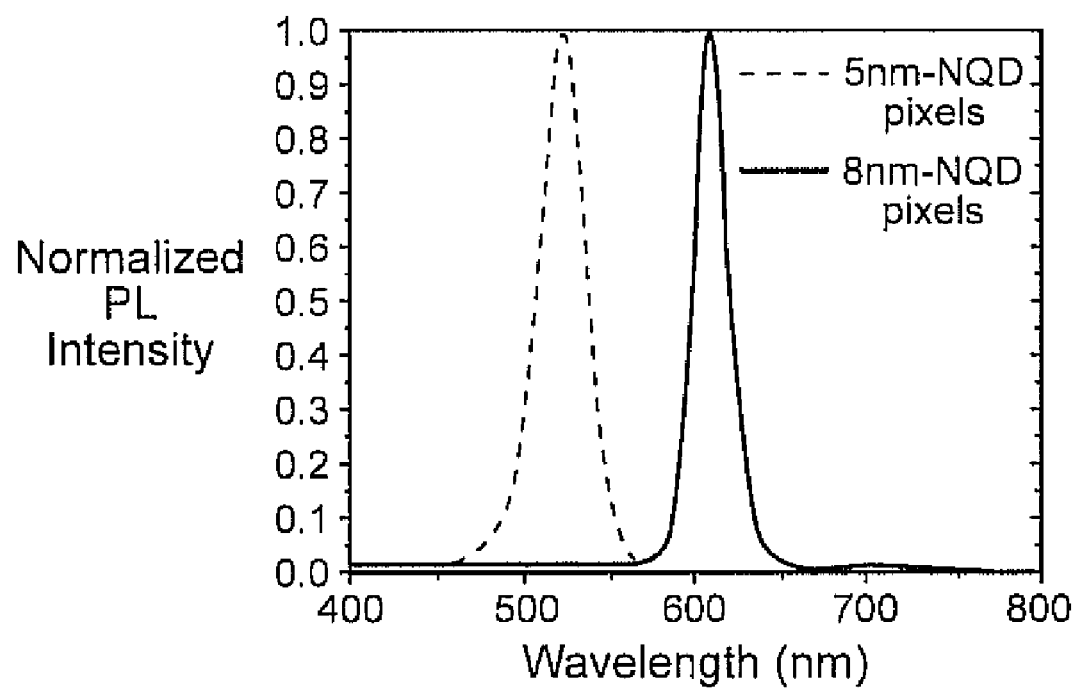

The photoluminescence spectra of the patterned QD pixels, as illustrated in FIG. 5B, are identical to that of the QD solutions used for mist deposition. Successful patterning of QD-emitter arrays was accomplished for pixels of varying size (from 200 μm-3 mm) using the mist deposition process.

Selective area mist deposition using a shadow mask allows patterned films to be deposited on a substrate with high resolution. The shadow mask blocks deposition to certain areas of the substrate, while allowing film formation in areas not shielded by the mask, generally corresponding to apertures in the shadow mask. This approach may be term selective-area mist deposition, or shadow-mask mist deposition. The use of a high resolution shadow mask and precise alignment control allows QD film lateral resolutions of 50 microns or less, along with monolayer-level control of film thickness. This remarkable combination of monolayer thickness control and high lateral resolution is unobtainable using conventional film formation methods. For example, spin coating allows good thickness control, but no area-selective patterning of the film.

Fabrication of an RGB Matrix QD-LED Using Shadow-Mask Deposition

The described film deposition and patterning using mist deposition is capable of fabricating an RGB matrix of QD-LEDs. The fabrication process can be realized by sequentially patterning of multi-color QD emissive layers in the course of mist deposition process using multiple registered shadow masks. This approach allows fabrication of both passive matrix and active matrix front-planes of QD displays.

Figure 6A:
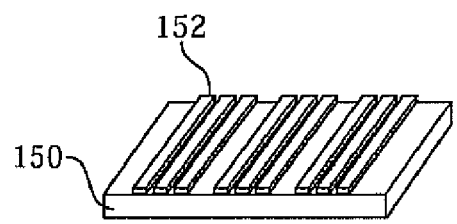
FIGS. 6A-6E show schematic illustration of an example shadow mask-patterned sequential mist deposition of red, green, and blue QD LED pixels for the fabrication of a full color display.

FIGS. 6A-6E give a schematic illustration of an example shadow mask-patterned sequential mist deposition of red, green, and blue QD LED pixels for the fabrication of full color display. In the matrix, each pixel share the same LED configuration except that the QD size varies for RGB colors. FIG. 6A shows the ITO electrodes 152 in the form of stripes, which may be 200 μm to 1000 μm wide, structured on a glass surface by means of conventional sputtering, lithography, and wet etching. The substrates are then thoroughly cleaned in chloroform, acetone and water and subjected to an UV-ozone treatment. Next, homogenous layers of PEDOT:PSS and Poly-TBD (hole transport layer, HTL) are deposited sequentially and annealed at the same conditions. The PEDOT and HTL layer need not be patterned since a conductivity calculation shows that cross-talk, resulting from a lateral current flow between adjacent rows and columns, is negligible.

Figures 6B, 6C, 6D:
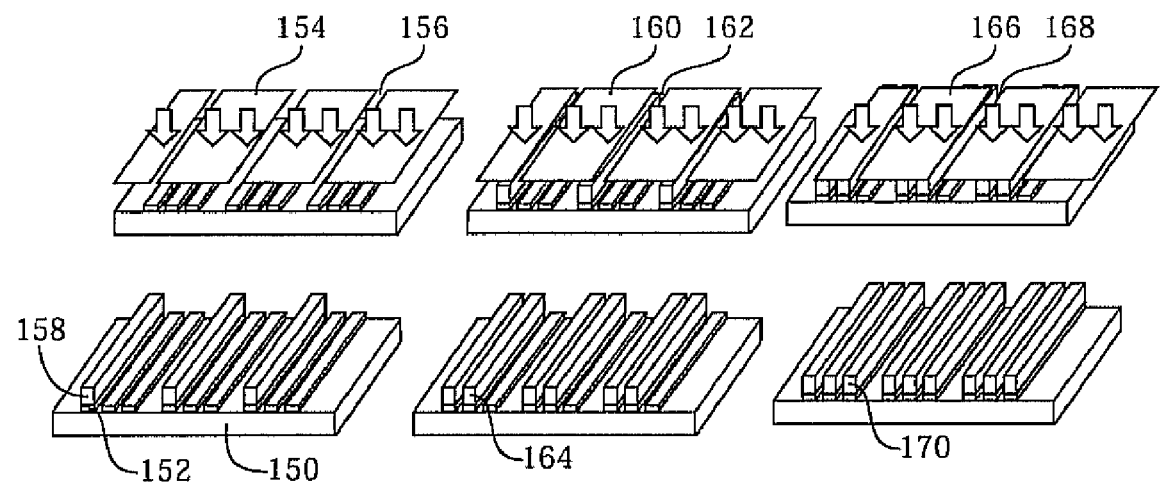

FIG. 6B shows deposition of red-emitting QD layer 158 on electrodes of the substrate 150 by aligning apertures 156 in mask 154 with the electrodes desired to be coated. FIG. 6B shows the first emissive layer 158, here comprising red-emitting QDs, is mist-deposited selectively with an aperture 156 in shadow mask 154 aligned to the corresponding ITO anode stripe 152. This may be followed by an in-situ annealing process to remove the liquid carrier and to solidify the stripes of QD films.

FIG. 6C shows, in a similar manner, a stripe layer 164 of green emitting QDs shadow mask deposited using apertures 162 in mask 160 positioned over the corresponding ITO stripes. The green-emitting QDs form patterned layers side-by-side adjacent to the red-emitting QDs.

FIG. 6D shows the blue-emitting QD layer 170 is formed using shadow mask 166 with apertures 168. For each layer of QDs, the corresponding shadow mask may be aligned only to the bottom ITO marks in order to minimize the misalignments between successive deposition layers. The same in-situ annealing process may be executed for all QD layers.

Figure 6E:
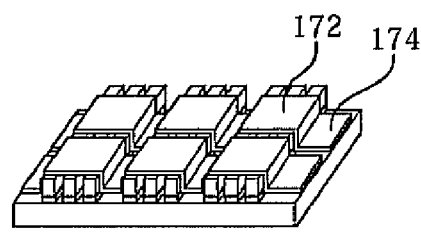

Finally, FIG. 6E shows parallel $Alq_3$/Ca/Al cathode stripes 172, with contact electrodes 174, are formed aligned perpendicularly to the underlying QD and anode stripes. The cathodes may be evaporated as a top cathode and shaped using shadow masks. The RGB pixels can simply be defined by the intersection of those rows of ITO anode and columns of Alq3/Ca/Al cathode. Other anode and cathode materials, and electrode configurations, may be used. The RGB configuration and order of deposition shown is exemplary. Two-color and four color displays may be formed by an analogous approach.

Shadow mask-patterned deposition can readily produce pixel sizes down to 200 μm (or 128 ppi display resolution). Recent advancements in ultrafine masks allow resolutions to about 50 μm (or 496 ppi display resolution) to be achieved. The adoption of integrated in-situ mask alignment stages can give fast (<10 second) alignment accuracy within ±1 μm, which is superior to typical required accuracies for LED pixels (±5 μm), and helps improve manufacturing efficiency and yield in QD-LED display technology.

The optimized QD layer thickness in LEDs may be highly dependent on the size and structure of the QDs. For instance, the red-emission QD-LED with a ~2 ML-thick QD layer exhibited a high efficiency, high maximum luminance, high color purity and showed an organic emission-free EL spectrum, whereas the best device performance was demonstrated for the orange, yellow-, and green-emission QD-LEDs with ~2.5 ML, ~4 ML, and ~7 ML thickness of the corresponding QD layers. The variation of the optimized thickness of the QD layers with size and shell structure of the QDs is consistent with the reported result that the free carrier injection into smaller QDs exhibits considerably lower efficiency than the injection into larger ones of the same composition. This effect may be due to the decreased mismatch between the conduction bands of the QDs and underlying hole transport layers (poly-TPD).

Figure 7A:
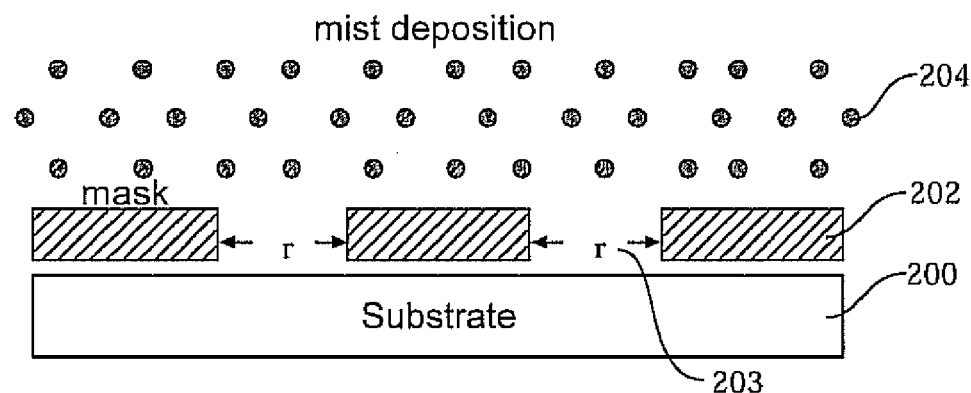
FIGS. 7A-B show a schematic of mist deposition of QDs through shadow masks, and non-ideal cases of patterned QD films caused by solution penetration (left) or sidewall shadowing effects (right).

FIG. 7A shows an example process in which QD film can be patterned on a substrate 200 using a mechanical (shadow) mask 202, having apertures 206. Mist droplets such as droplet 204 only reach the substrate surface by passing through the apertures of the shadow mask 202.

Insulating plastic, or ceramic films or plates, can be used in the shadow masks for selective area mist deposition. The mask material is preferably resistant to the liquid carrier to avoid droplet-induced dissolution. To minimize the side-wall shadowing effect at the edge of the mask openings, the location of the field screen may be adjusted above the substrate, and the voltage applied between them also may be adjusted. In some examples, substantially all droplets of QDs solutions ejected from the atomizer are accelerated vertically towards the substrate with approximately uniform density and velocity across the entire substrate surface.

Figure 7B:
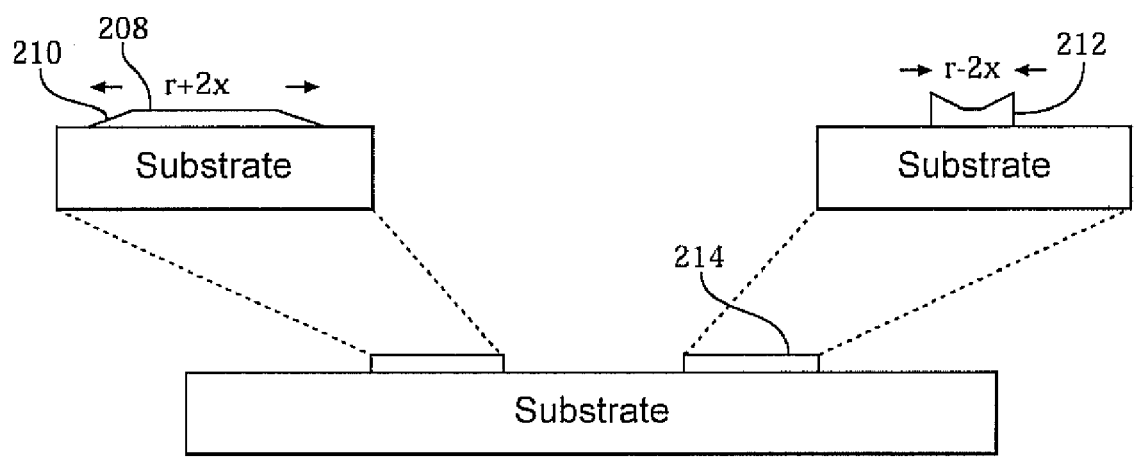

FIG. 7B shows a patterned film 214 formed on the substrate using shadow mask mist deposition. Exaggerated representations of thickness non-uniformity are shown at 208 and 212. Penetration of the deposited solution underneath the mask may blur the pixels and reduce resolution of the matrix display, leading to a thickness profile as shown at 208, the thickness profile deviating from an approximate step function due to the tapered edges 210. Sidewall shadowing effects may give a thickness profile such as shown at 212.

In some examples, there is no significant gap between the shadow mask and the substrate surface. In other examples, a gap may exist, but can be minimized according to manufacturing limits and desired resolution. For example, a gap may be less than a desired resolution, for example between 1 micron and 1 mm, such as between 10 microns and 500 microns.

During evaporation of the liquid carrier following through-the-mask deposition, the area covered by the liquid carrier (initially corresponding to the aperture in the mask) may gradually shrink, dragging any quantum dots near the edges of the area towards the center. As a result, the final dry pattern area covered by the QDs may be smaller than the size of the aperture in the mask. This shrinkage, if significant, can be factored in to the mask design. For example, the mask aperture may have a dimension approximately 10% or greater than that of the corresponding dry pattern dimension desired.

The droplet volume, deposition pressure, mask-substrate separation, and electric field intensity may be adjusted to optimize the deposition process. A partial cure or full cure of a deposited film may be applied before movement of the shadow mask, particularly if the mask is in contact with the substrate. For example, sufficient liquid carrier may be removed from a deposited film so that it is robust enough to avoid significant damage by further processing steps, with further treatments and/or curing achieved later. A deposited film may be cured after mask removal.

In some examples, an aerosol deposition process may be used that is a hybrid of mist deposition and spray deposition, for example using a droplet size distribution peak diameter of less than one micron, but using a medial flow velocity (gas or liquid) to impart a velocity contribution to the droplets relative to the substrate surface. Aspects of the examples of the present invention are discussed in further detail below.

Mist Deposition

In an example mist deposition process, a liquid precursor (e.g. particles such as nanoparticles suspended in a liquid carrier) is delivered to a substrate in the form of a very fine mist of droplets. The droplets coalesce into a liquid film on the substrate, and the liquid carrier is then removed to leave a layer of particles on the substrate.

In an example approach, the liquid precursor is carried by a gas (typically nitrogen) to an atomizer, which produces a mist of droplets which is then carried to deposition chamber. The droplets may be micron scale, or in some cases submicron (having a diameter less than 1 micron). The mist droplets arrive at the substrate, where they coalesce to form a liquid film on the substrate. Gravity and/or an electrical potential may be used to induce the droplets to reach the substrate. There can be lower waste compared to spin coating. The liquid film can then be thermally cured to evaporate the liquid carrier, leaving a thin layer of solid on the surface.

Mist deposition can be used with variously shaped substrates, and does not have inherent limitations regarding substrate size. In contrast to spin-coating, mist deposition can be used to produce area-selective thin film deposition (to obtain patterned films), for example using mechanical shadow masks.

In some examples of mist deposition, the relative velocity between the substrate surface and impinging droplets is due the effects of gravity and (optionally) an electric potential. The relative velocity when reaching the substrate surface need not include a contribution from the velocity within the liquid supply line (though this may be present to some degree), and may be dominated by the electrostatic effects. In some examples of mist deposition, a charge is imparted to the droplets and an opposite charge is imparted to the surface or a conducting substrate support. The relative electric potential can be adjusted so as to control the deposition rate, and hence film thickness for a given deposition time.

In some example of the present invention, a substrate may be exposed to a droplet cloud, for example as a mist of droplets. The term aerosol deposition may be used to include mist deposition, spray deposition, and other deposition processes in which liquid droplets impinge on a surface. In some examples of mist deposition, a liquid precursor is used that includes a suspension of the material, such as particles, to be deposited. An example display fabrication process comprises passing a suspension of quantum dots in a liquid carrier through an atomizer to produce a mist of droplets. Each droplet typically includes a suspension of one or more quantum dots. In examples of the present invention, the average (mean) droplet size, or the peak diameter from a size distribution curve, may be approximately 1 micron or less, such as approximately 0.25 microns or less.

In examples of mist deposition, QDs enter a deposition chamber at approximately the same speed as the carrier gas, and there is no significant acceleration at the nozzle tip as used in typical spray deposition. The droplet size may be approximately 1 micron or less. In contrast, spray deposition typically does not use an atomizer, and larger droplets are used. Films of QDs can be approximately equal to five times the diameter of the deposited QDs, such as those used in LED/display manufacturing. In contrast, spray deposition does not allow such thin films with controllable and uniform thickness. In some examples, the film thickness may be approximately equal to or less than 5 diameters of the QDs. Further, an electric field can be used to control deposition rate. The distance between the mist outlet and the substrate can also be adjusted to control the deposition process. A mist deposition apparatus may use one or more atomizers.

Embodiments of the present invention are not limited to the example mist deposition apparatus described. Mist deposition apparatus that may be adapted for use with embodiments of the present invention are further described in U.S. Pat. Nos. 5,456,945 to McMillan, 6,116,184 and 6,258,733 to Solayappan et al., and US2003/0118947 to Grant, and other configurations known to those skilled in the art may be adapted for use with embodiments of the present invention.

In examples of mist deposition, an aerosol of droplets, for example submicron size droplets, is produced. The droplet diameter can be well controlled, compared with conventional spray deposition. Droplets may be conveyed by gravitational, electrostatic, and fluid forces (for example, due to flow of the carrier gas) to the substrate surface. The conditions at the substrate surface may be ambient atmospheric pressure and temperature and pressure. A liquid source can provide a liquid carrier that is directed to an atomizer, or other apparatus for providing an aerosol. The atomizer generates droplets, such as sub-micron droplets with average particle diameters less than one micron, in some examples approximately equal to or less than 0.25 μm.

The aerosol, or droplet mist, is directed to a deposition chamber by a carrier gas, such as air, nitrogen, or other inert gas. The small size of the liquid droplets in mist deposition (compared with conventional spray deposition) promotes a highly uniform coating of the substrate. The droplet mist passes through a showerhead and a metal field screen, and then enters an electric field gradient created between the substrate (or substrate support) and the field screen. Electrostatic forces attract the droplets to the substrate surface, and diffusive forces may be sufficient to form a uniform coating if desired. The substrate may be rotated slowly, e.g. at about 10 rpm, to promote uniform deposition while avoiding significant centrifugal forces on the liquid film. Non-deposited mist droplets can be carried into an exhaust stream by a carrier gas.

Selective Area Mist Deposition of a Display

The use of shadow masks allows QD-LEDs to be laterally integrated on a substrate. A first array of QD-LEDs, emitting a first color, is deposited using selective area mist deposition using a shadow mask. The mask is then displaced laterally (and/or another shadow mask provided), and a second array of QD-LEDs, emitting a second color, is deposited. Typically, three films may be deposited, corresponding to red, green, and blue emission, for a full color display. However, other combinations are may be fabricated, including two-color, four color, IR or UV emitting devices.

Selective area mist deposition may also be used for deposition of other layers used for device fabrication, such as electrodes, electron or hole transport materials, insulating layers, photoresist layers, and the like. Mist deposition may be combined with other approaches, such as other lithographic and deposition approaches, as appropriate. A production line may include one or more mist deposition apparatus, possibly with each depositing a different film, or may include one or more mist deposition apparatus and other deposition apparatus as required.

In contrast, spin coating of QD layers allows control over film thickness, but lacks patterning capability. Hence, spin coating is only well suited for unpatterned displays, such as monochromatic devices, unless additional lithographic processes are used. Embodiments of the present invention require no additional lithography of an emissive layer (or equivalent active layer) after selective area mist deposition of the layer.

Ink-jet printing and screen printing have been used for the manufacture of OLED display. However, unlike most solution processed OLEDs, the efficiency and brightness of QD-LEDs are highly dependent on the thickness of the emissive QD layer in the device active region. Embodiments of the present invention allow improved thickness control of an emissive or other active layer compared with printing methods.

Stamping-based QD patterning approaches have also been investigated, but are limited by the lack of a covalent and efficiently conductive linkage between nanoparticles and the substrate surfaces during the stamping process, leading to a low processing yield as well as degraded LED performance. In addition, the dimensions of QD-LED displays will be constrained by the limited size of the stamps, making such an approach inadequate for large area panel display. Embodiments of the present invention allow large area displays to be fabricated, and there is no physical limitation known at present beyond that of the deposition chamber.

Selective area mist deposition may also be used for the deposition of other light emitting materials, for patterned monochromatic displays, and for other devices such as emitters and photovoltaic devices such as solar cells. Liquid precursors used in embodiments of the present invention may include organic luminescent materials, such as low molecular weight materials, polymers, monomers, precursors for luminescent materials, and the like.

Spray Deposition

Spray deposition may use any appropriate carrier gas, such as an inert gas such as nitrogen, and the velocity of droplets relative to the surface includes a substantial contribution from the velocity of the carrier gas. In some embodiments of the present invention, multicolor quantum dot displays may be fabricated using spray deposition, for example using shadow masks for selective area spray deposition.

In spray deposition, the relative velocity between droplets and the surface may include a significant contribution from the velocity of an incoming carrier gas used to carry the liquid precursor to the nozzle, the gas typically decompressing after leaving the nozzle. The shadow mask techniques described herein, for example in relation to mist deposition, may also be applied to improved forms of spray deposition. For example, a quantum dot layer may be deposited using spray deposition using an aqueous medium or other liquid carrier to form droplets.

In some examples of the present invention, selective area spray deposition using a shadow mask may be used.

Liquid Carrier (Solvent)

The liquid carrier used to form the suspensions of the material to be deposited may be an organic or inorganic liquid, or a combination thereof. For example, suspensions of quantum dots may be formed in liquids such as alcohol, ketones such as acetone, aldehydes, ethers, aromatic organics such as toluene, water, and the like.

In some examples of the present invention, the liquid carrier is an aqueous medium, such as an aqueous solution including a surfactant. For example, the liquid carrier may comprise water or an aqueous solution. In the case of aqueous liquid media, an elevated temperature may be used to avoid condensation on the sides of the deposition apparatus. For example, mist deposition using aqueous media such as water may be performed in the temperature range 40° C. to 90° C., in particular between approximately 70° C. and approximately 80° C.

The temperature in the deposition chamber, the time for droplets to reach the substrate, and volatility of the liquid carrier used may be chosen to avoid substantial evaporation of droplets before reaching the substrate.

However, the examples given above are not limiting on the identity of liquid carrier used. Any medium capable of supporting a suspension of quantum dots may be used. The surfaces of the quantum dots may be functionalized to facilitate formation of uniform suspensions, for example to reduce aggregation tendencies. Further, the liquid precursor may include other components, for example surfactants, to facilitate spreading of the droplets on the surface. For example, components included to reduce surface tension may be included.

Layer Thickness

The layer thickness obtained may be determined by the application. In the case of QD-LEDs, a layer thickness may correspond approximately to the range 1-10 monolayers of quantum dots, and more particularly the thickness may correspond approximately to 1-5 monolayers. For example, for smaller quantum dots (e.g. for blue emission), the layer thickness may approximate to 3 monolayers, whereas for longer wavelength emission, a layer thickness approximating 1 or 2 monolayers may be used. Here, the term "monolayer" may refer to the diameter or other appropriate dimension of the quantum dots used.

QD-LEDs

Mist deposition is ideal for depositing ultra-thin QD films for advanced displays, allowing (1) precise film thickness control (e.g. within ±1 monolayer) at and below 20 nm film thicknesses, such as thickness corresponding to 1-2 QD monolayers, and (2) the simultaneous compatibility with selective deposition. Mist deposition further allows (3) the efficient use of the precursor solution with QDs suspended in it (low material losses), (4) low curing temperature ($\leqq 100°$ C.) throughout the entire deposition sequence, (5) high throughput, and (6) conformality of coating.

Mist deposition of QDs allows the fabrication of large-area display panels with substrate areas up to and greater than Generation 4 (410 mm×410 mm). Mist deposition fabrication of QD-LEDs is low-cost, scalable, and high-throughput. In some examples, the substrates may be flexible, Other Applications Applications of mist deposition further include fabrication of other devices using QDs (or other materials deposited using aerosol deposition, in particular mist deposition). Other devices include lighting systems, photovoltaic devices, electronic devices (such as transistors, nanoscale electronic switches, memory devices, and the like), lightwave communication devices (such as waveguides, optical switching, and the like), photonic devices (such as Bragg reflectors), photovoltaic devices (such as solar cells), electrooptical devices, optical elements (such as lenses, diffractive elements, waveguides, reflective films, antireflective films, and the like), radiation sources (such as visible and/or IR emitters, illumination applications, lasers), synthetic opals or other gemstones, sensing applications (such as chemical or biochemical sensing, including sensor arrays), and the like.

In particular, methods and apparatus according to the present invention include QD photovoltaic devices, in particular QDs solar cells. For other display applications, mist deposition can be used to deposit other luminescent materials.

Quantum Dots (QDs)

The inorganic nature of typical nanocrystal quantum dots makes QD-LEDs potentially more resistant to moisture and oxygen in the ambient environment than molecular emitters. Reliable, long-lifetime operation of QD-displays may be achieved without expensive, hermetic packaging of the LED arrays that are required in the current OLED manufacturing. However, QDs may be inorganic or organic, for example semiconductors (e.g. chalcogenides and other semiconductors), metals, polymers, glass, other optical materials, and the like.

QD emission wavelength can be easily tuned by varying the size and/or the material composition of nanoparticles to cover a broad spectrum, e.g. 0.4-0.8 μm for CdSe/(Cd,Zn)S core-shell QDs and 0.8-4.0 μm for Pb(S,Se) QDs. In addition, modifications of the nanocrystal surface may result in its improved quantum yield and photochemical stability, and consequently, in improved efficiencies of the QD-based luminescent and photovoltaic devices. The emission wavelength of QDs can be easily tuned by varying the size of nanoparticles during the synthesis process, even if their chemical composition remains essentially the same, so that a single device configuration and the same fabricating procedure can be used to produce emissions covering the entire visible (00.4 μm-0.8 μm) spectrum.

Quantum dots may be prepared by colloidal synthesis or any other method known in the art. Examples of the present invention include deposition of other particles. Quantum dots suitable for use in display applications are available commercially from Ocean NanoTech. Examples include CdSe and CdSe/ZnS core-shell QDs in toluene or water.

Surface functionalization allows dispersion of QDs in various liquids, including water, for example as described in U.S. Pat. Nos. 7,160,613 and 6,319,426 to Bawendi et al. The use of surfactant molecules disposed on QD surfaces can help avoid QD aggregation on liquid evaporation.

QDs may be spheres, prolate spheres, rods, cylinders, ovoid, nanocrystallites, or other form. QDs may be generally uniform composition (such as uniform spheres), core-shell structures (such as core-shell nanospheres, hollow shells, and the like), or other form. QDs may comprise semiconductors, metals, and/or dielectric media. The term QDs may also include nanoparticles having a diameter between 0.1 and 100 nanometers, more particularly between 0.5 and 50 nanometers.

Multilayer and 3D Structures by Mist Deposition

Examples of the present invention include multi-layer structures, in which one or more layers are formed by aerosol deposition, such as selective area mist deposition. For example, a device may include a first predetermined number of monolayers of a first particulate species, and a second predetermined number of monolayers of a second particulate species. For example, a first layer of QDs may be adjacent a second layer of QDs, for example first and second QD layers may be formed on proximate but separate electrodes, such as parallel stripe electrodes. A multilayer device may include a waveguide, superlattice, refractive or diffractive structure, or other device. The combination of multilayer and patterned depositions allows 3D structures to be formed. For example, a patterned layer of QDs may be covered with a layer of non-QD material, also deposited by mist deposition (or other deposition approach used).

Substrates

The substrate surface on which a patterned film is formed may be electrically conducting, in which case an electric potential may be used to enhance the rate of deposition. Example substrate materials which may be used as surfaces for deposition include semiconductors (for example for the fabrication of electronic devices), magnetic materials, polymer films and other flexible substrates, glass, metals, conducting oxides, organic films, and the like.

The substrate may be a flexible substrate. For example, mist deposition can be used to fabricate QD-LED displays on a flexible substrate, such as a polymer, for flexible panel displays. Low-cost, solution-based processing of monodisperse, well-characterized QDs is well suited to fabricate next-generation flexible panel displays featuring high brightness and contrast, wide viewing angle, rich selection of colors, small depth, low power consumption, and long lifetime.

Uniform photoluminescence was obtained experimentally from QDs deposited on flexible substrate. There was no appreciable change in film performance as the flexible substrate was flexed, even if the flexing was severe. The flexible substrate used was a polyethersulphone (PES) polymer film, approximately 0.25 mm thick. Other flexible substrates may be used, such as other polymer films. A successful experiment was performed with NQD (nanocrystal quantum dot) film deposition on flexible substrate. Substrates may be rigid, flexible, stationary, in motion, or otherwise disposed. A substrate and shadow mask may be slowly rotated together (relative to the deposition chamber and incident droplet mist) to enhance deposition uniformity.

Flexible substrate materials may include polyesters, polyimides, polyolefins (such as polyethylenes and polypropylenes, and cyclic polyolefins), polyethylene derivatives such as polyethylene terephthalate and polyethylene naphthalate, polysulfones (including polyethersulfones), polycarbonates, polyethers, and the like. A polymer substrate may have a protective coating, such as an anti-scratch coating. A flexible substrate may include electrodes, such as metal oxide films, including indium oxides such as indium tin oxide or indium cerium oxide. Electrodes may be multilayer conducting films, such as metal/metal oxide multilayer films.

Deposition may be achieved with the substrate in motion. In some examples, a roll-to-roll (R2R) process can be used for film deposition. An example process includes providing a flexible substrate including electrodes, possibly in the form of a roll, and moving the substrate through a mist deposition chamber. The movement may be stepped, for example allowing a shadow mask aperture to register with an electrode pattern during a deposition time, the substrate then being moved on for the next deposition. The substrate may be cut into display (or other application based) sizes after mist deposition is completed on at least a portion of the substrate.

In some examples, a substrate may include one or more electrodes, such as patterned electrodes. Patterned electrodes may include electrode stripes or other elongated electrodes. For example, electrodes may be configured to provide a matrix addressed device, for example with other electrode stripes elongated in a generally orthogonal direction within a parallel plane. Electrodes may be configured to give a desired pattern, such as a 7-segment or more complex display electrode configuration, or as desired.

Electrical potentials may be selectively applied to the patterned electrodes to facilitate deposition of desired structures. For example, if quantum dots are intended to be deposited on particular electrodes, those electrodes may be maintained at an electric potential opposite to that imparted to the droplets, whereas electrodes on which quantum dots are not desired to be deposited may be given an electric potential of the same sign as that of the droplets.

In some approaches to selective area mist deposition, substrate surfaces may be selectively chemically functionalized, or spatial variations of surface energy used to help obtain a patterned film. For example the hydrophobicity of a surface may be varied spatially so as to encourage droplet spreading on some areas of the surface and not others. An indium tin oxide, or other electrode material, stripe may have a different surface energy to an underlying substrate (such as glass), and the liquid carrier used selected to give preferential deposition and/or film spreading on the electrode surface. In one experiment, good coverage was obtained on an ITO surface, but not on a glass surface. In one example, photoisomerism of a surface species may be used to control surface energy and the local surface tension, for example using selective UV exposure. Patterned ionomers, other charged species, or other surface species may be used to obtained patterned deposition. A gas flow over the surface may be used to blow away non-spread droplets.

Mist deposition can be used with non-planar substrates, including curved substrates. Substrates may be curved and/or flexible. A curved substrate, such as a generally parabolic shape, may be used to modify layer thickness and/or uniformity over a large area substrate.

Shadow Masks

The mask material may be solvent-resistant to avoid droplet-induced damage. In order to minimize the side-wall shadowing effect at the edge of the mask openings, the location of the field screen above the substrate and the voltage applied between them may be adjusted, so that droplets ejected from the atomizer are accelerated vertically towards the substrate with uniform density and velocity across the entire substrate surface. The penetration of the deposited solution underneath the mask blurs the pixel and reduce resolution of the matrix display.

In some examples, the shadow mask may be electrically conducting (such as a metal). The electrical potential on the mask relative to the substrate and that imparted to droplets may be adjusted to control the deposition rate and/or the resolution of deposited structures. The resolution may be defined as, for example, the width of a stripe of deposited material. For example, electric field line patterns formed by the substrate and the mask can be used to further control deposition rate, resolution, and the like.

In other examples, an electrically insulating mask may be used, for example a plastic, ceramic, glass, or other electrically insulating material. Preferably, the mask material is resistant to chemical degradation by the liquid carrier, at least over the typical time scales of the deposition.

A shadow mask may be placed in contact with a surface, substantially adjacent to the surface, or proximate to the surface. For example, the separation between the mask and surface may be no greater than five times the feature dimension of a deposited feature (such as a stripe width). A shadow mask in contact with the surface, or substantially adjacent to the substrate surface, may help prevent the liquid precursor from spreading under the mask.

In some cases, masks may be oversized, i.e., featuring aperture dimensions larger than the dimensions of the final pattern on the surface. A deposited film may shrink slightly as the liquid carrier evaporates.

A shadow mask may be moved during deposition, for example to obtain thickness gradients. In other examples, a shadow mask may be repositioned between depositions of different material species (such as different QD diameters), optionally without removing the substrate from the deposition chamber. A different shadow mask may be interposed between a source of droplets and the substrate between deposition steps. An intervening liquid carrier removal step may be used.

Post-Deposition Processing

For example, after mist deposition, the liquid carrier may be removed by vacuum, thermal treatment, gas flow, and or a combination of these or other techniques. Additional electrode, electron transport, hole transport, and/or other layers may be deposited. A structure may be detached from some or all of the substrate, for example using a sacrificial layer. Other processing steps may be used, as will be clear to those skilled in the arts.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

Having described our invention, we claim:

1. A process for fabricating a semiconductor quantum dot layer on a substrate, the semiconductor quantum dot layer being an emissive layer of a multi-color display, the process comprising:
   providing a liquid precursor including semiconductor quantum dots dispersed in a liquid carrier;
   generating a mist of droplets of the liquid precursor, the mist of droplets comprising droplets each including a suspension of one or more of the semiconductor quantum dots in the liquid carrier;
   directing the mist of droplets towards the substrate, so as to form a liquid precursor film on the substrate;
   using a shadow mask to pattern the liquid precursor film; and
   removing the liquid carrier from the patterned liquid precursor film so as to form the semiconductor quantum dot layer on the substrate,
   the semiconductor quantum dot layer being patterned by the shadow mask to form the emissive layer of the multi-color display,
   the multi-color display being a QD-LED (quantum dot light emitting diode) display.

2. The process of claim 1, further comprising using an atomizer to generate droplets of the liquid precursor.

3. The process of claim 1, the droplets having a diameter distribution with a peak diameter approximately equal to or less than 5 microns.

4. The process of claim 3, the diameter distribution having a peak diameter approximately equal to or less than 1 micron.

5. The process of claim 3, the diameter distribution having a peak diameter approximately equal to 0.25 microns.

6. The process of claim 1, further comprising
   aligning apertures within the shadow mask with electrodes on the substrate.

7. The process of claim 1, the droplets being conveyed into a deposition chamber by a stream of carrier gas.

8. The process of claim 7,
   the deposition chamber including a shower head through which the droplets enter the deposition chamber, and a field screen,
   the liquid precursor film having a deposition rate on the substrate,
   the deposition rate being adjustable by an electrical potential between the field screen and the substrate.

9. The process of claim 8, the stream of carrier gas having a inlet speed for entering the deposition chamber,
   the deposition rate being substantially independent of the inlet speed.

10. The process of claim 1, the substrate including a plurality of electrodes.

11. The process of claim 10, the semiconductor quantum dot layer being formed selectively on the plurality of electrodes.

12. The process of claim 11, the substrate further including a second plurality of electrodes,
   the process further including selectively forming a second semiconductor quantum dot layer on the second plurality of electrodes.

13. The process of claim 1, the semiconductor quantum dot layer having a layer thickness,
   the semiconductor quantum dots having a quantum dot diameter,
   the layer thickness being between 1 and 5 times the quantum dot diameter.

14. The process of claim 13, the semiconductor quantum dot layer having a layer thickness variation less than the quantum dot diameter.

15. A process for fabricating a semiconductor quantum dot layer on a substrate, the semiconductor quantum dot layer being an emissive layer of a multi-color display, the process comprising:
   providing a liquid precursor including semiconductor quantum dots dispersed in a liquid carrier;
   generating a mist of droplets of the liquid precursor, the mist of droplets comprising droplets each including a suspension of one or more of the semiconductor quantum dots in the liquid carrier;
   directing the mist of droplets towards the substrate, so as to form a liquid precursor film on the substrate;
   using a shadow mask to pattern the liquid precursor film; and
   removing the liquid carrier from the patterned liquid precursor film so as to form the semiconductor quantum dot layer on the substrate,
   the semiconductor quantum dot layer having a layer thickness,
   the quantum dots having a quantum dot diameter,
   the layer thickness being between 1 and 5 times the quantum dot diameter,
   the semiconductor quantum dot layer being patterned by the shadow mask to form the emissive layer of the multi-color display,
   the multi-color display being a QD-LED (quantum dot light emitting diode) display.

16. The process of claim 15, the semiconductor quantum dot layer having a layer thickness variation less than the quantum dot diameter.

* * * * *

UNITED STATES PATENT AND TRADEMARK OFFICE
CERTIFICATE OF CORRECTION

| | | |
|---|---|---|
| PATENT NO. | : 8,222,061 B2 | Page 1 of 1 |
| APPLICATION NO. | : 12/057819 | |
| DATED | : July 17, 2012 | |
| INVENTOR(S) | : Jian Xu et al. | |

It is certified that error appears in the above-identified patent and that said Letters Patent is hereby corrected as shown below:

In the Specification:

At column 2, line number 47, After field Delete "," Insert -- . --

At column 3, line number 21, Delete "a"

At column 4, line number 15, Delete "7A-B" Insert -- 7A-7B --

At column 5, line number 10, After generating Delete "a"

At column 7, line number 35, Delete "2A-B" Insert -- 2A-2B --

At column 9, line number 1, Delete "isan" Insert -- is a --

At column 11, line number 9, Delete "orange," Insert -- orange -, --

At column 13, line 56, Delete "are"

At column 16, line number 1, Delete "(Ods)" Insert -- (QDs) --

Signed and Sealed this
Second Day of July, 2013

Teresa Stanek Rea
*Acting Director of the United States Patent and Trademark Office*